(12) United States Patent
Dening et al.

(10) Patent No.: US 6,720,831 B2
(45) Date of Patent: Apr. 13, 2004

(54) POWER AMPLIFIER PROTECTION CIRCUIT

(75) Inventors: David Dening, Stokesdale, NC (US); Kathleen Muhonen, Greensboro, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 10/133,793

(22) Filed: Apr. 26, 2002

(65) Prior Publication Data

US 2003/0201835 A1 Oct. 30, 2003

(51) Int. Cl.[7] .............................................. H02H 7/20
(52) U.S. Cl. .................... 330/298; 330/207 P; 330/285
(58) Field of Search .............................. 330/285, 298, 330/207 P, 279

(56) References Cited

U.S. PATENT DOCUMENTS

| | | | | |
|---|---|---|---|---|
| 5,083,096 A | * | 1/1992 | Miyazaki | 330/279 |
| 5,543,760 A | * | 8/1996 | Honda et al. | 330/298 |
| 5,903,192 A | * | 5/1999 | Ludwig et al. | 330/279 |
| 6,459,340 B1 | * | 10/2002 | Apel et al. | 330/298 |
| 6,525,611 B1 | * | 2/2003 | Dening et al. | 330/298 |

OTHER PUBLICATIONS

Pusl, Joe et al., "SiGe Power Amplifier ICs with SWR Protection for Handset Applications," Microwave Journal 44, No. 6, Jun. 2001.

* cited by examiner

*Primary Examiner*—Henry Choe
(74) *Attorney, Agent, or Firm*—Withrow & Terranova, PLLC

(57) ABSTRACT

A power amplifier circuit comprises a sensing circuit and a processing circuit adapted to detect voltage peaks in an output of a power amplifier. If the voltage peak is above a predetermined threshold level, the processing circuit acts to reduce bias provided to the power amplifier, thereby reducing the output levels.

12 Claims, 6 Drawing Sheets

POWER AMPLIFIER PROTECTION CIRCUIT

FIELD OF THE INVENTION

The present application is directed to power amplifiers and more particularly to a circuit that protects power amplifiers from operating at excessive voltages that might cause damage to the power amplifier.

BACKGROUND OF THE INVENTION

Wireless transmitters typically comprise signal processing circuitry followed by a power amplifier that elevates the power of a signal to be transmitted prior to emission by an antenna. Such power amplifiers are becoming more common as a result of the ever increasing proliferation of mobile terminals that incorporate some form of wireless transmitter.

The term "mobile terminal" encompasses pagers, cellular phones, personal digital assistants, laptops equipped with wireless modems, and the like. These mobile terminals are subject to numerous telecommunications standards and regulations which govern their behavior. Many of these standards govern the power levels with which the mobile terminals are allowed to transmit signals. This is done to prevent cross-channel interference in some cases, as well as help the mobile terminals conserve battery power. In many instances the power levels are controlled, either by a base station or by the mobile terminal at the instruction of the base station.

One side effect of this mobile environment is that the power amplifier of the transmitter has to withstand large voltage standing wave ratios (VSWR) at elevated supply voltages. GSM in particular may generate a VSWR of 15:1 at times. This can quickly lead to device burnout as voltage peaks during successive periods at collectors of the transistors forming the power amplifiers exceed tolerable voltage levels.

In addition to mobile terminals, wireless LANs of computing devices are also becoming more common. The computing devices include a wireless transmitter that likewise has a power amplifier that may be subject to extended voltage peaks and damage therefrom.

Thus, there remains a need for a way to protect power amplifiers in transmitters from voltage peaks during successive periods that exceed design parameters and may cause burnout in the power amplifier.

SUMMARY OF THE INVENTION

The present invention adds a feedback loop to a power amplifier. The power amplifier, in an exemplary embodiment, is part of a transmitter chain. The feedback loop comprises a sensing circuit and a processing circuit. When the sensing circuit senses that the output of the power amplifier is high enough that operation at that operating point for successive cycles or periods would damage the power amplifier, the sensing function causes the processing circuit to change the bias provided to the power amplifier in such a manner that the output power is lessened to an acceptable level.

In a first embodiment, the sensing circuit is formed from a transistor that acts as an avalanche diode. In a second embodiment, the sensing circuit is formed from a plurality of diodes. In a third embodiment, the sensing circuit is formed from a plurality of transistors. Common among these sensing circuits is that they remain off until the output of the power amplifier exceeds a predetermined threshold. Above the predetermined threshold, the current passing through the sensing circuit increases rapidly with small increases in applied voltage above the threshold.

The processing circuit may act on the bias circuit differently depending on different embodiments. In an exemplary embodiment, the processing circuit comprises a current mirror that sinks bias current from the input of the power amplifier, thereby reducing the output of the power amplifier. In a second exemplary embodiment, the current mirror turns off the bias current when the sensing circuit detects an output over the threshold. Alternative actions may take place depending on the nature of the bias circuit used.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention is designed to prevent burnout of power amplifiers. The most common implementation will be in wireless transmitters such as those used by mobile terminals or wireless modems; however, any power amplifier may be protected from burnout through the teachings of the present invention.

Figure 1:
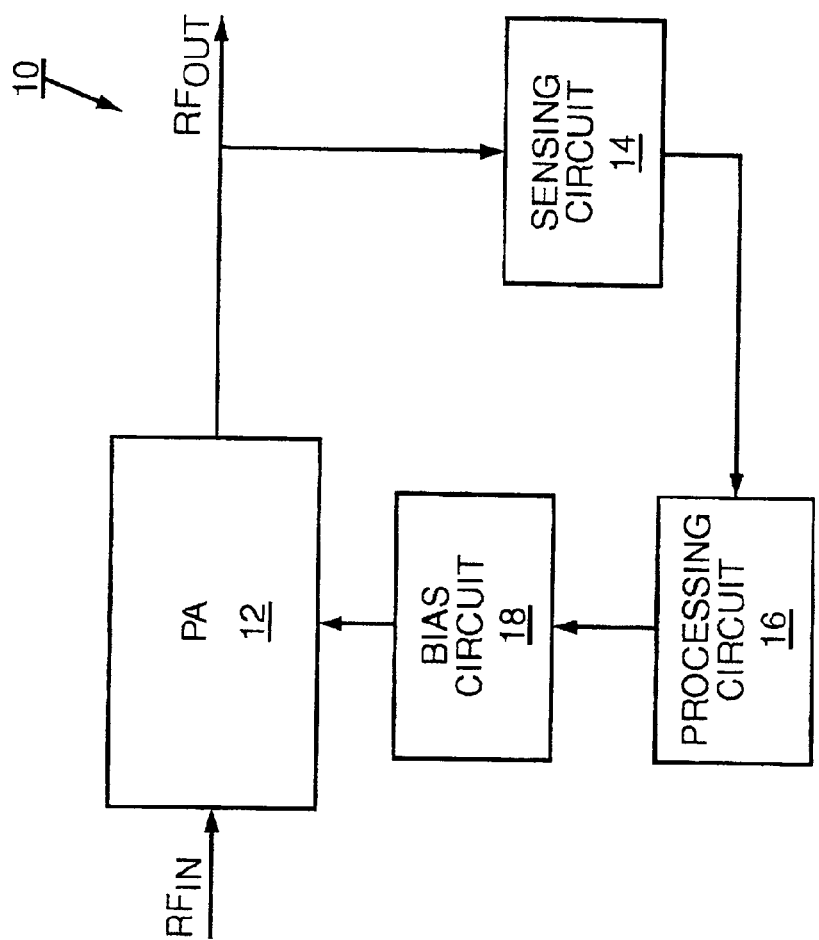
FIG. 1 illustrates a top level schematic diagram according to one embodiment of the present invention.

The present invention modifies a power amplifier into a power amplifier circuit 10, such as illustrated schematically in FIG. 1. The power amplifier circuit 10 comprises a power amplifier (PA) 12, a sensing circuit 14, a processing circuit 16, and a bias circuit 18. The power amplifier 12 receives an $RF_{IN}$ signal, amplifies it, and produces an $RF_{OUT}$ signal. The power amplifier 12 also receives a bias signal from the bias circuit 18. In some embodiments, the bias circuit 18 may be incorporated into the semiconductor having the power amplifier 12, but need not be.

Given the current desire to minimize extra components, it is possible that the power amplifier 12, the sensing circuit 14, the processing circuit 16, and the bias circuit 18 are all printed as a single monolithic integrated circuit, but again, need not be.

The power amplifier 12 may be a transistor cell array comparable to those illustrated in U.S. patent applications Ser. No. 09/878,461, filed Jun. 11, 2001; and Ser. No. 09/952,524, filed Sep. 14, 2001; and U.S. Pat. Nos. 6,265,943; 5,608,353, and 5,629,648, which are all hereby incorporated by reference. Alternatively, the power amplifier 12 may be a single transistor, and will be represented as such in the subsequent Figures. It is to be understood, however, that despite its representation as a single transistor, the power amplifier 12 may in fact be a transistor array as described in the previously incorporated applications and patents or any other transistor amplifier configuration available to those skilled in the art.

The sensing circuit 14 is coupled to the $RF_{OUT}$ signal and detects whether the $RF_{OUT}$ signal has risen above a predetermined threshold. The predetermined threshold is, in an exemplary embodiment, set below a voltage at which extended operation would cause burnout of the power amplifier 12. The sensing circuit 14 outputs a sensed signal to the processing circuit 16 when the predetermined threshold has been exceeded.

The processing circuit 16 receives the sensed signal from the sensing circuit 14 and modifies the bias point provided by the bias circuit 18 so as to reduce the bias provided to the power amplifier 12. This causes the power amplifier 12 to have a lower output, thus reducing the chance of burnout. The precise details of the sensing circuit 14 and the processing circuit 16 depend on the embodiment and will be explored further below.

Figure 2A:
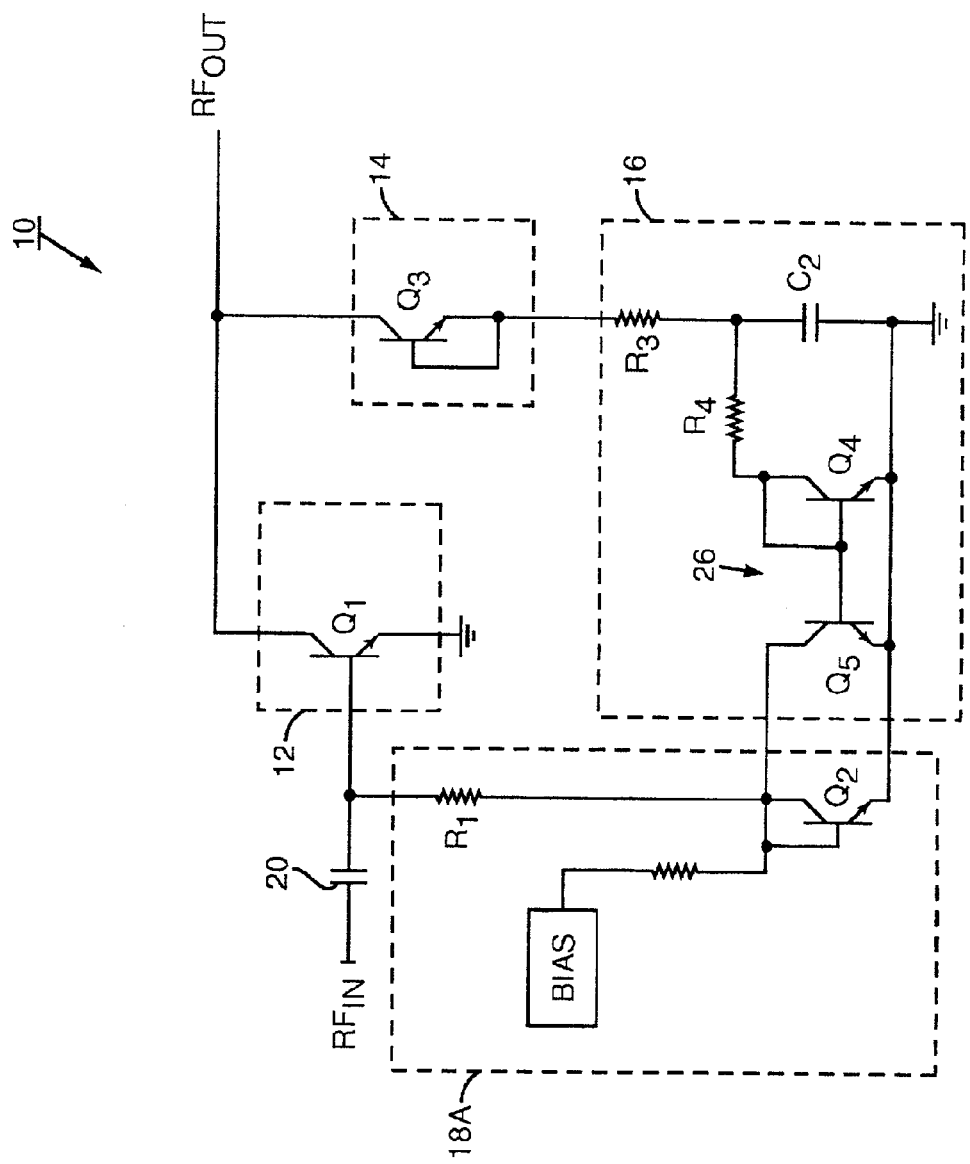
FIG. 2A illustrates a circuit level schematic diagram according to an exemplary embodiment of the present invention with a first bias circuit.

The bias circuit 18 may be of a number of different types as illustrated below. FIG. 2A illustrates a circuit level diagram of a first embodiment of the present invention with a first bias circuit 18A. The $RF_{IN}$ signal is coupled to the power amplifier 12 by a capacitor 20. The $RF_{OUT}$ signal is generated by the power amplifier 12. In the embodiment shown, the collector of a transistor $Q_1$, provides the $RF_{OUT}$ signal. A transistor $Q_3$, particularly the base-emitter junction of the transistor $Q_3$, is used as an avalanche diode to form the sensing circuit 14. The base-emitter junction begins to pass current when the applied reverse voltage exceeds a predetermined threshold. In an exemplary embodiment, the predetermined threshold comprises approximately 8 V. The current rapidly increases from the microampere range to the milliampere range with a small increase in applied voltage above the conduction threshold.

A resistor $R_3$ controls the magnitude of the current produced by the transistor $Q_3$. Resistors $R_3$ and $R_4$, along with capacitor $C_2$, form a low pass filter for filtering the current pulses produced by the transistor $Q_3$. The filtered current is then applied to the current mirror 26 comprised of transistors $Q_4$ and $Q_5$. The current flowing through $Q_4$ is mirrored across to the transistor $Q_5$ as a function of the respective sizes of the two transistors.

To create the mirrored current, the output of the current mirror 26 (transistor $Q_5$) sinks bias current from bias circuit 18A to ground that was destined for the power amplifier 12. In particular, as current flows through the transistor $Q_5$, less current is presented to diode connected transistor $Q_2$. Thus, less current passes through resistor $R_1$ for use by the power amplifier 12. This reduces the bias on the power amplifier 12 when peak RF voltages start approaching the destruction limits of the power amplifier 12.

Capacitor $C_2$, along with resistors $R_3$ and $R_4$, sets the loop response time. Resistor $R_3$ is determined by the need to limit current spikes through transistor $Q_3$. The value of $R_4$ determines the rate at which current passes into the current mirror 26. In an exemplary embodiment, the resistances of resistors $R_3$ and $R_4$ is 500 Ω. The capacitor $C_2$ sets the loop time constant. In an exemplary embodiment, the capacitance of capacitor $C_2$ is 1000 pF for loop stability. Where processing circuit 16 is integrated into the monolithic chip that contains the sensing circuit 14 and the power amplifier 12, it may be desirable to split the capacitor $C_2$ such that a portion of the capacitance of the capacitor is off the semiconductor.

It may be preferable to have a relatively long loop time constant. For example, if the loop time constant is short, an inductive pulse may be generated at the $RF_{OUT}$ port from the bias and/or matching network. This passes more current through the transistor $Q_3$, causing a regenerative oscillation. A longer loop time constant reduces the rate of change in the collector current of the power amplifier 12 and increases stability.

Figure 2B:
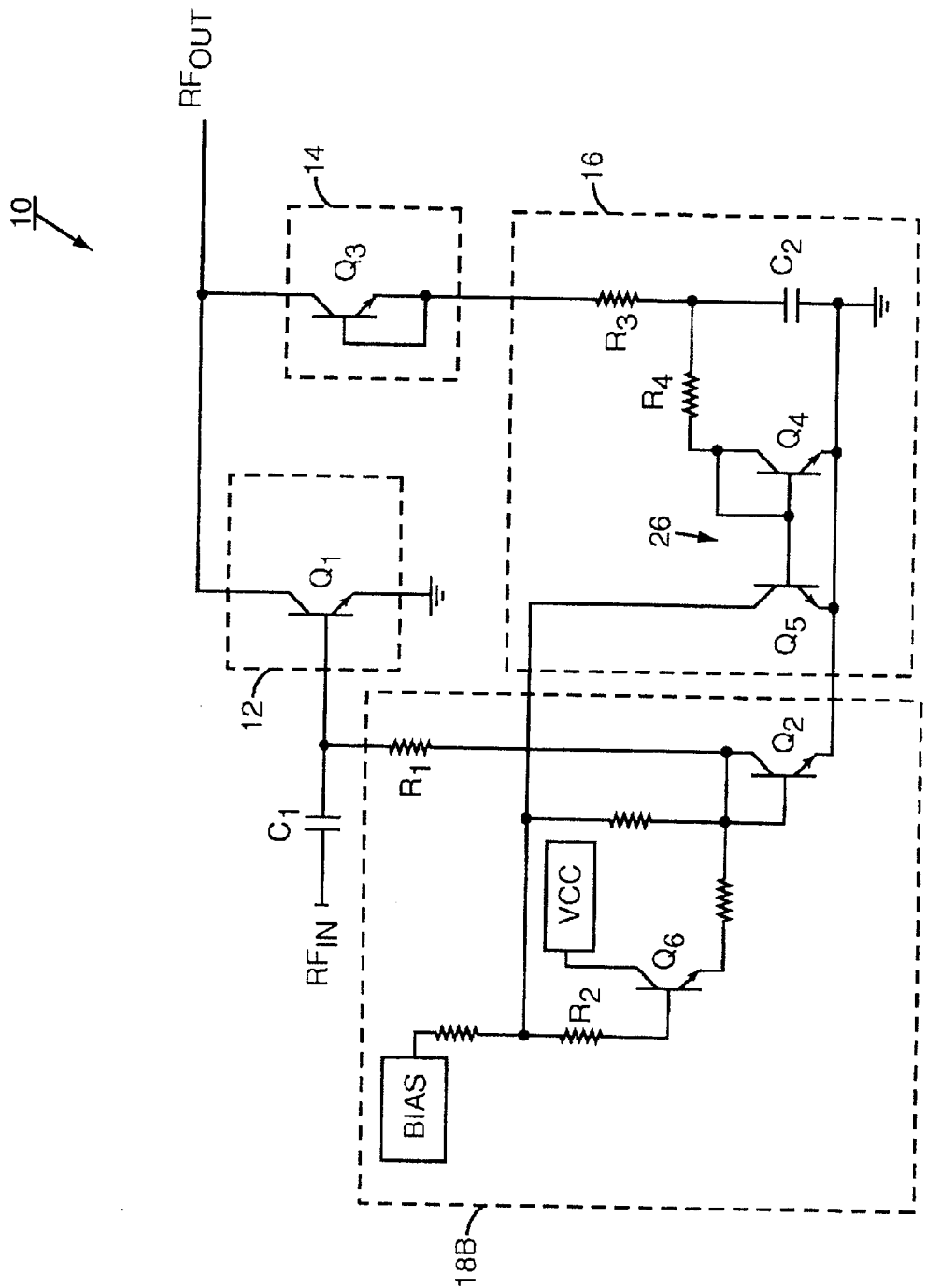
FIG. 2B illustrates a circuit level schematic diagram according to the embodiment of FIG. 2A with a second bias circuit.

A second bias circuit 18B is illustrated in FIG. 2B. In this embodiment of the bias circuit 18, as current increases in the transistor $Q_5$, the transistor $Q_6$ turns off because no current flows in $R_2$. As a result, the collector of the transistor $Q_2$ has little or no current, and the power amplifier 12 has no bias input. Thus, instead of shunting the current to ground, this embodiment significantly reduces or turns off the bias current entirely.

For further information about the bias circuit 18B, reference is made to commonly owned U.S. patent application Ser. No. 09/467,415, filed Dec. 20, 1999, which is hereby incorporated by reference in its entirety. Bias circuit 18B is sometimes referred to as a buffered passive bias network.

As would be appreciated, processing circuit 16 may be modified as needed to accommodate differing bias circuits 18.

Figure 3:
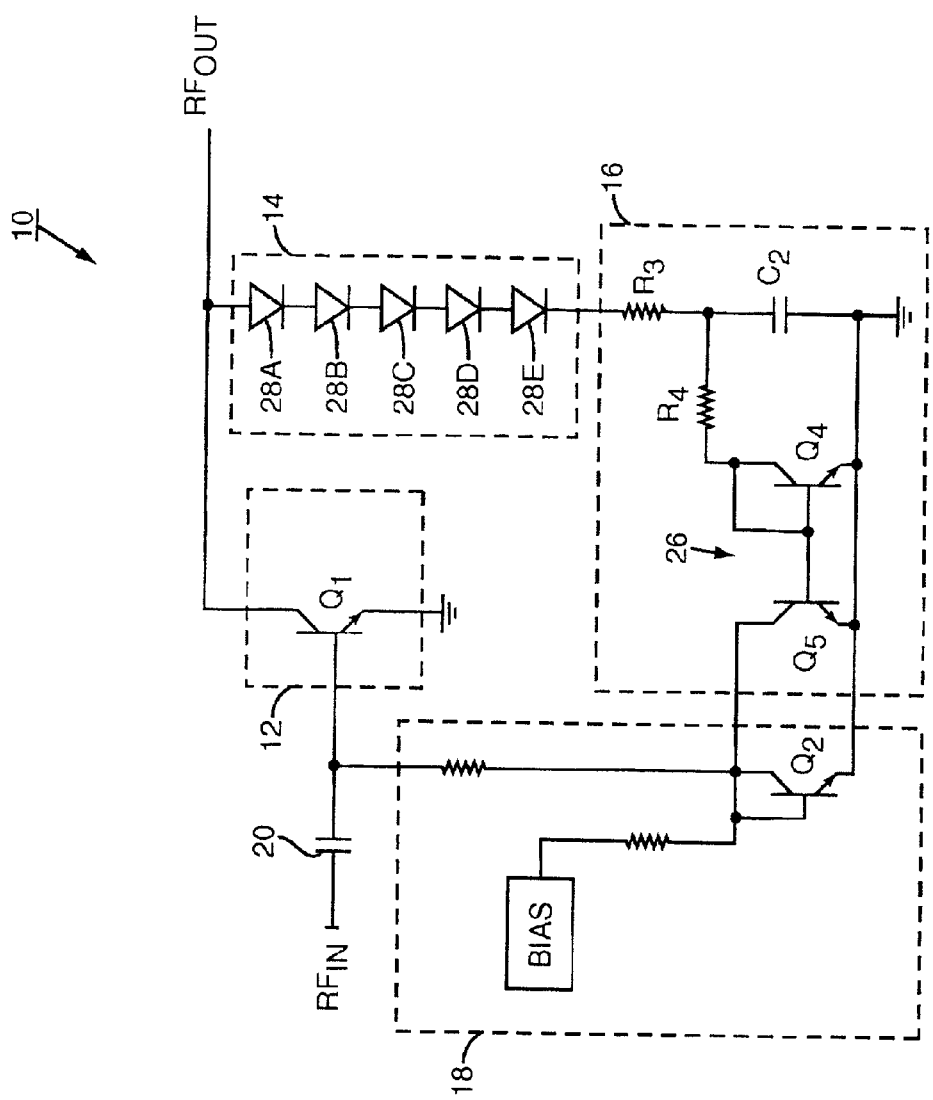
FIG. 3 illustrates a circuit level schematic diagram according to a second exemplary embodiment of the present invention.

In an alternate embodiment, the sensing circuit 14 may be formed by a string of diodes 28A–28E as illustrated in FIG. 3. The number of diodes 28 is determined by the desired threshold voltage above which the feedback loop should be operative. As with the previous embodiment, in this embodiment, this value may be approximately 8 volts.

Figure 4:
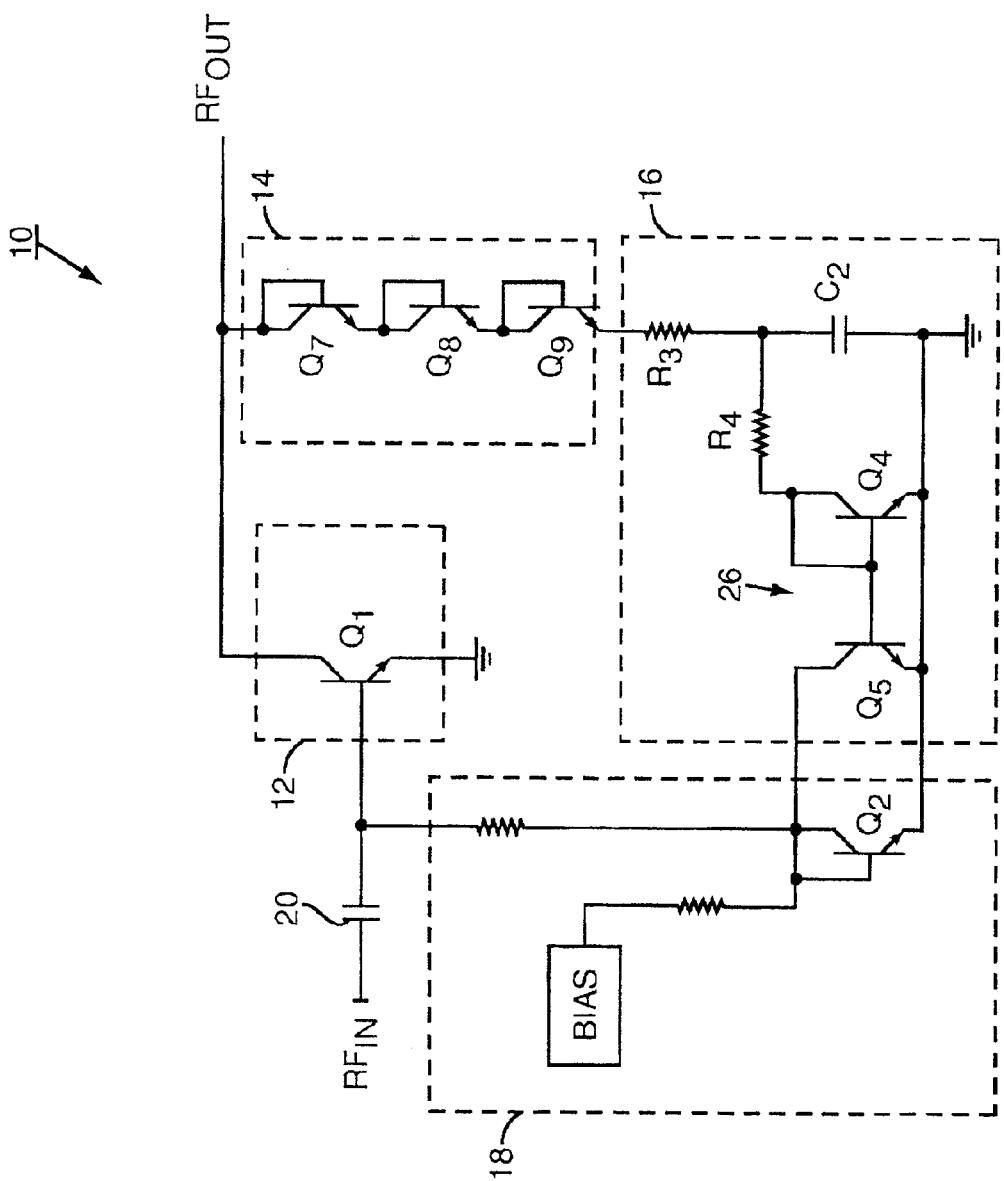
FIG. 4 illustrates a circuit level schematic diagram according to a third exemplary embodiment of the present invention.

FIG. 4 illustrates yet another alternate embodiment of the sensing circuit 14. In this embodiment, the diodes 28 of FIG. 3 are replaced with diode connected transistors $Q_7$–$Q_9$. Again, the number of diode connected transistors is determined by the desired threshold voltage above which the feedback loop should be operative.

Figure 5:
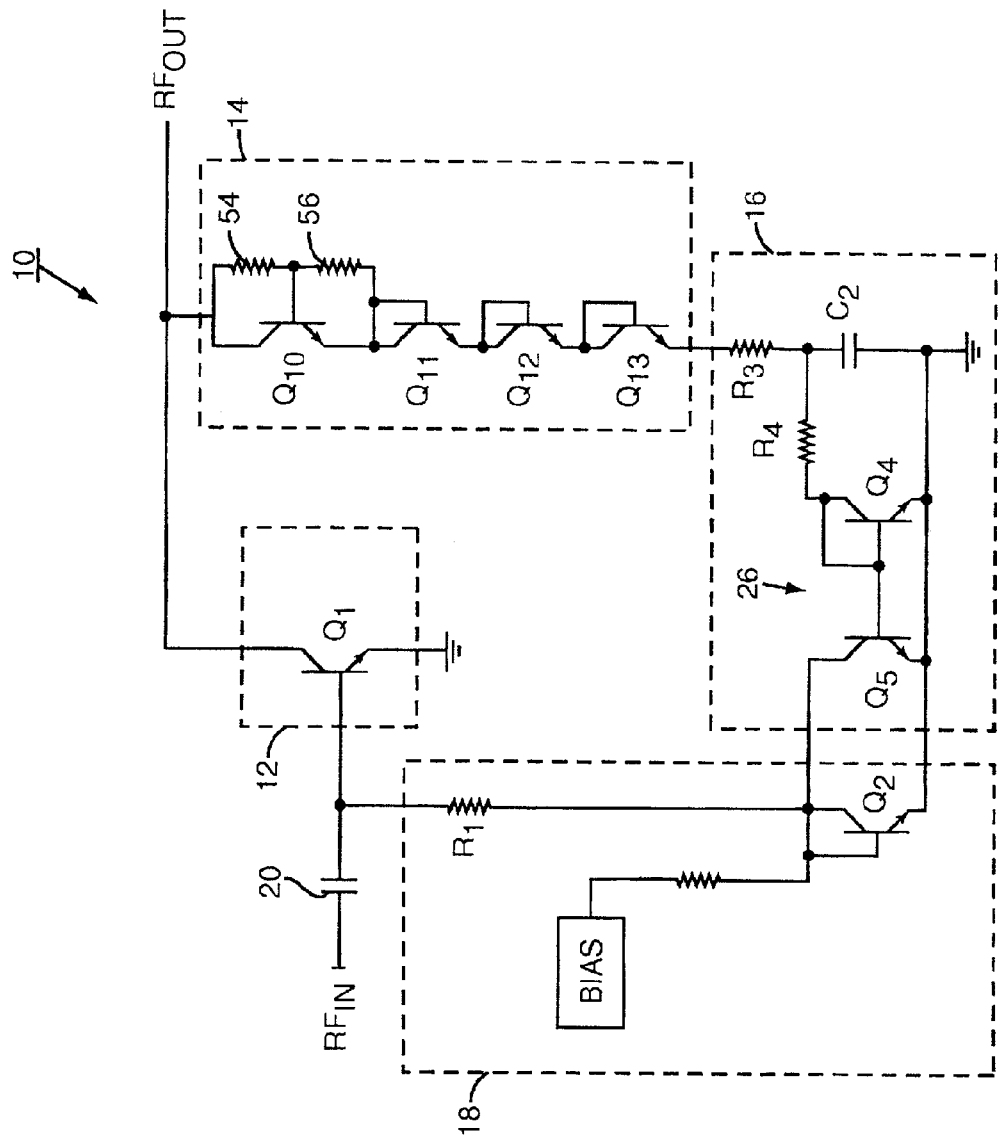
FIG. 5 illustrates a circuit level schematic diagram according to a fourth exemplary embodiment of the present invention.

FIG. 5 illustrates still another embodiment of sensing circuit 14. In this embodiment, the transistor $Q_3$ of FIG. 2A is replaced with a series of transistors that operate as diodes, much like in FIG. 4. However, a first transistor $Q_{10}$ cooperates with resistors 54, 56 to form a base to emitter multiplier circuit as is well understood. The resistors 54, 56 act to increase the current that is available when the transistor $Q_{10}$ does in fact turn on. Transistors $Q_{11}$–$Q_{13}$ act to increase the threshold voltage of the sensing circuit 14 so normal operation does not actuate the feedback.

Those skilled in the art will recognize improvements and modifications to the preferred embodiments of the present invention. All such improvements and modifications are considered within the scope of the concepts disclosed herein and the claims that follow.

What is claimed is:

1. A power amplifier circuit comprising:

a power amplifier;

a sensing circuit adapted to detect voltage peaks emitted by said power amplifier, said voltage peaks exceeding a predetermined threshold; and a processing circuit adapted to receive an input from said sense circuit and adjust a bias supplied to said power amplifier to reduce said voltage peaks to a level below said predetermined threshold, wherein said processing circuit comprises a current mirror.

2. The power amplifier circuit of claim 1 wherein said sensing circuit comprises a transistor.

3. The power amplifier circuit of claim 1 wherein said sensing circuit comprises a plurality of diodes.

4. The power amplifier circuit of claim 1 wherein said current mirror acts to reduce bias current supplied to said power amplifier, thereby damping said power amplifier to reduce said voltage peaks.

5. The power amplifier circuit of claim 1 wherein said processing circuit shunts a portion of a bias current from the power amplifier to ground, thereby reducing the bias applied to the power amplifier.

6. A method of controlling a power amplifier comprising:

sensing an output of said power amplifier with a sensing circuit; and reducing bias supplied to said power amplifier in relation to said output to reduce said output when said output exceeds a predetermined threshold, wherein reducing bias supplied to said power amplifier comprises mirroring a current from said sensing circuit across a current mirror.

7. The method of claim 6 wherein sensing an output of said power amplifier comprises sensing the output with an avalanche diode.

8. The method of claim 6 wherein sensing an output of said power amplifier comprises sensing the output with a diode.

9. The method of claim 6 wherein sensing an output of said power amplifier comprises sensing the output with a transistor.

10. The method of claim 6 wherein reducing bias supplied to said power amplifier comprises shunting a portion of a bias current to ground.

11. A power amplifier circuit comprising:

a power amplifier comprising an input and an output;

a sensing circuit coupled to said output and detecting peaks in said output, said sensing circuit generating a control signal when a peak above a predetermined threshold is detected; and a processing circuit receiving said control signal and adjusting a bias signal supplied to said power amplifier to reduce peaks in said output to a level below said predetermined threshold, wherein said processing circuit comprises a current mirror.

12. A power amplifier circuit comprising:

a power amplifier comprising an input and an output;

a transistor coupled to said output and sensing voltage peaks above a predetermined threshold in said output; and a current mirror coupled to said transistor and said input, said current mirror adjusting bias supplied to said input based on voltage peaks detected by said transistor.

* * * * *